(12) United States Patent
Schmidberger

(10) Patent No.: US 7,187,553 B2
(45) Date of Patent: *Mar. 6, 2007

(54) APPARATUS FOR COOLING SEMICONDUCTOR DEVICES ATTACHED TO A PRINTED CIRCUIT BOARD

(75) Inventor: Stefan Schmidberger, Straubing (DE)

(73) Assignee: Harman Becker Automotive Systems GmbH, Karlsbad (DE)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 251 days.

(21) Appl. No.: 10/914,624

(22) Filed: Aug. 9, 2004

(65) Prior Publication Data

US 2005/0128713 A1 Jun. 16, 2005

(30) Foreign Application Priority Data

Aug. 7, 2003 (EP) .................................. 03018046

(51) Int. Cl.
*H05K 7/20* (2006.01)
(52) U.S. Cl. ...................... 361/719; 361/699; 361/700; 361/704; 361/714; 165/80.3; 165/185; 174/252
(58) Field of Classification Search ................ 361/700, 361/704, 719, 687, 689, 707–710, 717–718, 361/722; 257/704–727, 737, 738, 778; 24/457, 24/458; 248/316.7, 505, 510; 165/80.3, 165/185; 174/15.2, 252; 29/602.1, 841, 29/854, 592.1, 832
See application file for complete search history.

(56) References Cited

U.S. PATENT DOCUMENTS

| | | | |
|---|---|---|---|
| 4,621,304 A | | 11/1986 | Oogaki et al. .............. 361/386 |
| 5,307,236 A | | 4/1994 | Rio et al. .................... 361/720 |
| 5,883,782 A | * | 3/1999 | Thurston et al. ............ 361/704 |
| 5,883,783 A | * | 3/1999 | Turturro ..................... 361/704 |
| 5,920,120 A | * | 7/1999 | Webb et al. ................. 257/719 |
| 6,154,365 A | * | 11/2000 | Pollard et al. .............. 361/704 |
| 6,256,199 B1 | * | 7/2001 | Yusuf et al. ................ 361/699 |
| 6,381,136 B1 | * | 4/2002 | Nelson et al. .............. 361/704 |
| 6,560,113 B1 | * | 5/2003 | Ma ............................ 361/719 |
| 6,574,101 B2 | * | 6/2003 | Tanaka et al. .............. 361/687 |
| 6,809,930 B2 | * | 10/2004 | Mueller et al. ............. 361/704 |
| 6,885,557 B2 | * | 4/2005 | Unrein ....................... 361/704 |
| 2002/0051341 A1 | * | 5/2002 | Frutschy et al. ............ 361/700 |

OTHER PUBLICATIONS

Integral, Structural, natural convection cooled heatsink. Research Disclosure, pp. 238-240, Feb. 2001.

* cited by examiner

*Primary Examiner*—Michael Datskovskiy
(74) *Attorney, Agent, or Firm*—O'Shea, Getz & Kosakowski, P.C.

(57) ABSTRACT

An electronic assembly includes a semiconductor device mounted on a printed circuit board, a leaf spring and a cooling plate. A plurality of fasteners pass through co-axial apertures of the leaf spring, the printed circuit board and the cooling plate, such that a contact surface of the leaf spring imparts a force on the semiconductor device to retain the semiconductor device in a thermally conductive position with respect to the cooling plate. A positive cooling effect is achieved regardless of mounting conditions including orientation of the electronic assembly, and the position of the semiconductor device on the cooling plate.

26 Claims, 4 Drawing Sheets

APPARATUS FOR COOLING SEMICONDUCTOR DEVICES ATTACHED TO A PRINTED CIRCUIT BOARD

CLAIM OF PRIORITY

This patent application claims priority to European Application EP 03 018 046.7 filed on Aug. 7, 2003.

1. Field of the Invention

The present invention relates to the field of cooling semiconductor devices, and in particular to the field of devices for cooling semiconductor devices attached to a printed circuit board.

2. Related Art

The electric power consumed by a single semiconductor device, especially those with power transistors, has become so large that there are increasing instances where the device becomes heated to the point that reliability of the semiconductor device is decreased. The heat radiation to cool the semiconductor device relies upon heat transfer from the surface of the heated portion to the surrounding air. If the resistance of heat transfer between the surface of the heated element and the surrounding air is low, then the undesirable heat is suitably transferred. Therefore, by lowering the heat transfer resistance to the air, improved cooling of the semiconductor device is achieved. To reduce the heat transfer resistance to the air, the conventional approach has been to increase the surface area in contact with the air, as shown in FIG. 1.

FIG. 1 is a perspective view of a prior art heat radiating assembly for a semiconductor device. A radiating fin 102 is fastened to the integrated circuit (e.g., a dual-in-line package,) 104. The radiating fin may be made of material such as copper, aluminum, or the like, having good heat conductivity. The radiating fin includes a plurality of fine grooves 102a on the top surface of the semiconductor package to increase the surface area in contact with the air. The radiating fin 102 is attached to the top surface of the IC 104 using, an adhesive, or nuts and bolts. The heat generated by the IC 104 is conducted to the radiating fin 102 for cooling.

Attaching the radiating fin 102 directly to the IC 104 appears to be effective upon initial consideration, but it involves various problems in reality. First, the direction of the grooves 102a to magnify the surface area of the radiating fin 102 must be in the direction of the air flow. By this arrangement to improve the radiation effect, the direction of the IC 104 to be mounted on the printed circuit board is restricted to be in one direction. As a result, the wiring pattern on the printed circuit board is also subject to restriction.

Second, the technique used for attaching the radiating fin 102 to the IC 104 is often problematic. The technique for attaching the radiating fin 102 to the IC 104 must endure thermal stress for a long time, so that the radiating fin 102 is held securely attached to the IC 104 even when subject to vibration or shock. However, the technique used to attach the fin 102 must be adapted such that, under all possible thermal conditions, the semiconductor device does not experience excessive contact pressure resulting from the attachment of the fin. To achieve this, U.S. Pat. No. 4,621,304 to Oogaki et al. proposes an adapted construction of a heat sink as illustrated in FIG. 2 to adjust the height (b) 230.

As indicated in FIG. 2, first and second heat sinks 202, 222 are provided. The second heat sink 222 is cylindrically shaped and includes a thread 222a on the periphery thereof. The second heat sink 222 also includes a slot 222b on the top face thereof so as to be driven by a screwdriver. The first heat sink 202 attached to a shield case 213 includes a female thread 202a, so that the threaded heat sink 222 can be engaged with the first heat sink 202. The threaded heat sink 222 is adapted to be threadedly engaged with the female thread 202a of the first heat sink 202 from above the shield case 213, to which the heat sink 202 is attached, through a hole 213a.

The threaded heat sink 222 is passed through the hole 213a at the top of the shield case 213 and threadedly engaged with the threaded portion 202a of the heat sink 202. The heat sink 222 is pressed against an IC 204 mounted on a printed circuit board 201. To provide smooth contact and heat conduction between the threaded heat sink 222 and an IC 204, heat conductive rubber 221 with good heat conductivity may be previously attached to the IC 204 at the location that contacts the threaded heat sink 222. In such a case, the threaded heat sink 222 contacts the IC 204 through the rubber 221. Thus, any variation in the distance (a) between the electronic parts 204 and the heat sink 202 can be minutely compensated with ease by turning the threaded heat sink 222. Meanwhile, the heat sink 202 and the threaded heat sink 222 are in threaded contact and therefore the surface of contact between them is magnified, so that the heat conducted from the electronic parts 204 through the rubber 221 to the threaded heat sink 222 is easily conducted to the heat sink 202, and emitted to the ambient air through the shield case 213. As described in the foregoing, no matter how varied the distances between the first heat sink 202 and the electronic parts 204 may be, sufficient contact pressure and contact surface area for good heat conductivity is obtained by virtue of the second heat sink 222.

However, the conventional apparatus shown in FIG. 2 still exhibits some limitations as, for example, a costly manufacturing process, a relatively large number of specific parts, and unreasonable weight and height in view of the cooling effect achieved.

Therefore, there is a need for an improved apparatus for cooling semiconductor devices attached to a printed circuit board.

SUMMARY

An electronic assembly includes a semiconductor device mounted on a printed circuit board, a leaf spring and a cooling plate. A plurality of fasteners pass through co-axial apertures of the leaf spring, the printed circuit board and into the cooling plate, such that a contact surface of the leaf spring imparts a force on the semiconductor device to retain the semiconductor device in a thermally conductive position with respect to the cooling plate.

A positive cooling effect is achieved regardless of mounting conditions and the position of the semiconductor device on the cooling plate. Further, the manufacturing process is less costly, less parts are needed, and less weight and less height are required.

Other systems, methods, features and advantages of the invention will be, or will become, apparent to one with skill in the art upon examination of the following figures and detailed description. It is intended that all such additional systems, methods, features and advantages be included within this description, be within the scope of the invention, and be protected by the following claims.

DESCRIPTION OF THE DRAWING

The invention can be better understood with reference to the following drawings and description. The components in the figures are not necessarily to scale, emphasis instead being placed upon illustrating the principles of the invention. Moreover, in the figures, like reference numerals designate corresponding parts throughout the different views.

DETAILED DESCRIPTION

Figure 1:
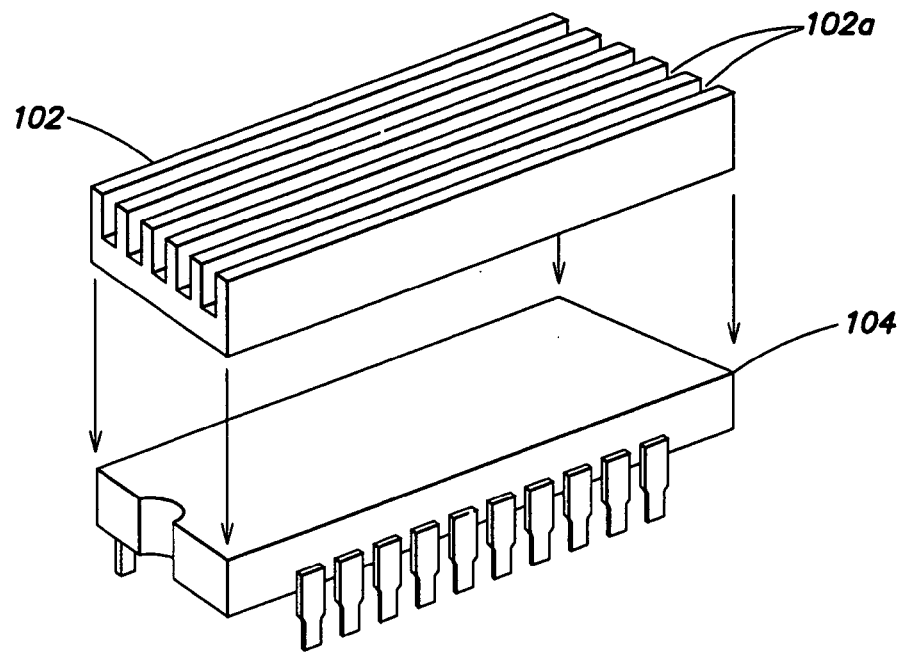
FIG. 1 is a perspective view of a prior art heat radiator assembly for a semiconductor device.
Figure 2:
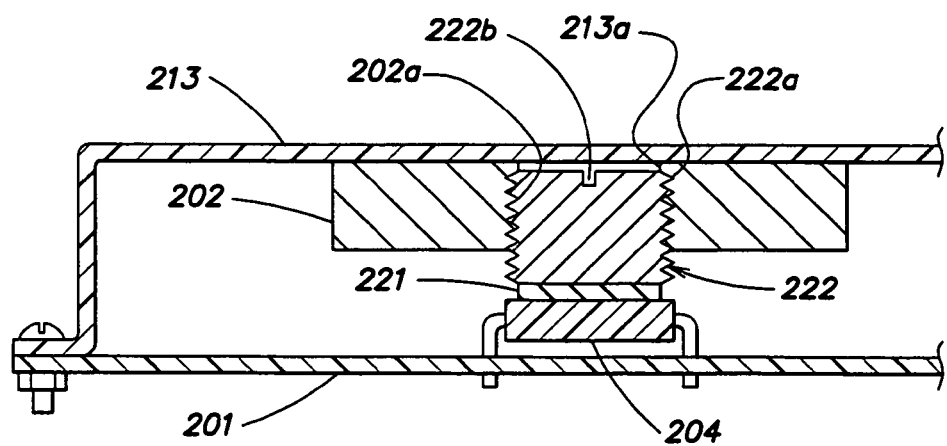
FIG. 2 is a perspective view of another prior art heat radiator assembly for a semiconductor device.
Figure 3:
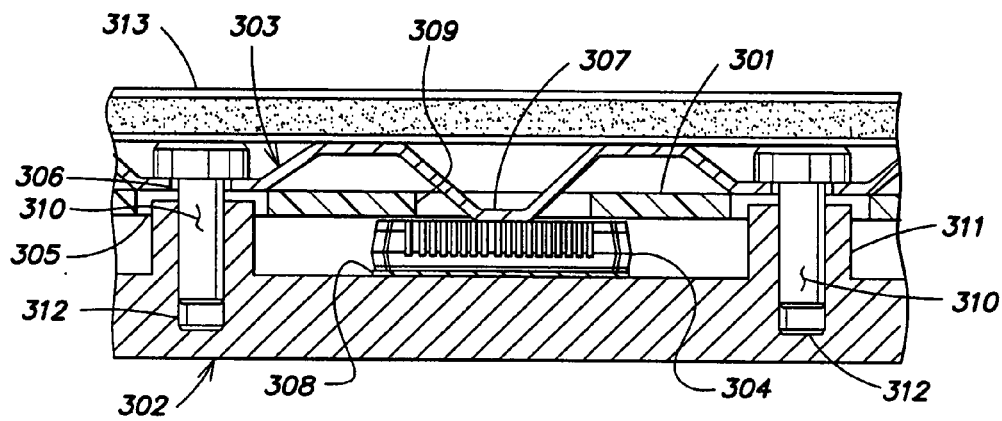
FIG. 3 is a sectional view of a printed circuit board sandwiched between a cooling plate and a spring plate, the spring plate providing a spring force to a semiconductor device mounted on the printed circuit board.

The present invention provides an apparatus for cooling semiconductor devices attached to a printed circuit board. As shown in FIG. 3, a printed circuit board 301 is sandwiched between a cooling plate 302 and a spring plate 303 (e.g. a leaf spring).

The printed circuit board 301 is a plate of electrically non-conductive material (e.g., resin plate, ceramic substrate) comprising at least one structured electrically conductive layer (e.g., metallization) for connecting electrical devices such as semiconductor devices mounted on the printed circuit board. The printed circuit board 301 has first and second sides and further comprises a plurality of apertures 305 formed through the first and second sides. The first side of the printed circuit board 301 comprises a semiconductor device 304 (e.g., power amplifier, voltage regulator, or a power switch, et cetera) attached thereto (e.g., by soldering). In FIG. 3 the printed circuit board 301 comprises a further aperture 309 arranged such that it is covered by the semiconductor device 304.

The cooling plate 302 is adjacent to the first side of the printed circuit board 301 and has first and second sides itself. The second side of the cooling plate 302 has thermal contact with the semiconductor device 304. In order to further improve the thermal contact, a heat conductive element 308 (e.g., a thermal compound) may be applied between the semiconductor device 304 and the cooling plate 302. Additionally or alternatively an electrical insulator may be provided between the semiconductor device 304 and the cooling plate 302. The cooling plate 302 is preferably metallic and may be provided with a plurality of fine grooves on the first side thereof to increase the surface area in contact with the air (not shown in the FIGS.).

The spring plate 303 may also be metallic and arranged adjacent to the second side of the printed circuit board 301. The spring plate 303 may be wave-like embossed and it comprises a dome 307. The dome 307 is positioned in the aperture 309 of the printed circuit board 301 and has a height relative to its ground line that exceeds the heights of all other waves or domes due to embossing such that the dome 307 is in direct contact with the semiconductor device 304 and exerting force to the semiconductor device 304 as a result of the spring force provided by the spring plate 303. The spring plate 303 comprises apertures 306 that are operably positioned in alignment with the apertures 305 of the printed circuit board 301.

To connect the spring plate 303 to the cooling plate 302, securing members are provided that extend through the apertures 305 of the printed circuit board 301 and the apertures 306 of the spring plate 303. As shown in FIG. 3, the securing members may be bolts 310 in connection with integral noses 311 formed in a single piece from the cooling plate 302. The integral noses 311 extend partly into the apertures 305 while the bolts 310 extend through the apertures 305 and 306 into tap holes 312 arranged in the integral noses 311. A cover plate 313 may be arranged adjacent to the spring plate 302 as an outside surface opposite to the outside surface established by the cooling plate 302.

The apparatus shown in FIG. 3 can be easily mounted. Starting with the cooling plate 302 as a base plate, the printed circuit board 301 with the semiconductor device 304 mounted thereon is arranged on the base plate with the semiconductor device 304 face down. The height of the semiconductor device 304 exceeds all other elements arranged on this side of the printed circuit board 301. The leaf spring 303 is operably positioned such that the apertures are aligned. The next step is to screw the bolts 310 into the tap holes 312. In the apparatus of FIG. 3, the spring force provided by the spring plate 303 depends essentially on the material used, its structure, its thickness, and the size of the dome 307.

The spring plate 303 provides a spring force forcing the semiconductor device 304 against the cooling plate 302, thus providing good thermal contact between the semiconductor device 304 and the cooling plate 302. The cooling plate 302 has a lower heat transfer resistance to the air due to a larger surface in contact with the air.

Figure 4:
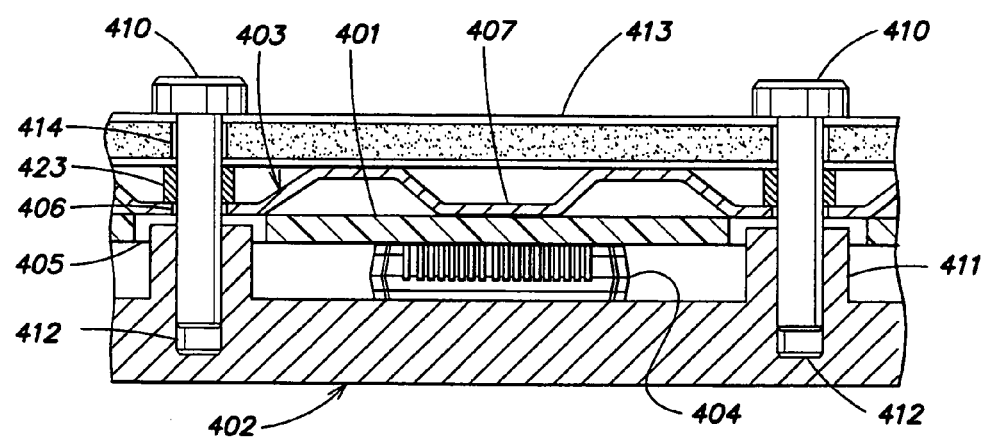
FIG. 4 is a sectional view of another printed circuit board sandwiched between a cooling plate and a spring in connection with a cover plate, the spring plate providing a spring force via the printed circuit board to a semiconductor device mounted on the printed circuit board.

FIG. 4 is a sectional view of a printed circuit board 401 sandwiched between a cooling plate 402 and a spring associated with a cover plate to provide a spring plate 403. The spring plate 403 provides a force against the printed circuit board at the backside of where the semiconductor is mounted. In the apparatus shown in FIG. 4, again the printed circuit board 401 is sandwiched between the cooling plate 402 and the spring plate 403.

Similar to the printed circuit board illustrated in FIG. 3, the printed circuit board 401 is a plate of electrically non-conductive material comprising at least one structured electrically conductive layer. The printed circuit board 401 has first and second sides and includes a plurality of apertures 405 formed through the first and second sides. A semiconductor device 404 is arranged on the first side of the printed circuit board 401.

The cooling plate 402 made of heat conducting material is adjacent to the first side of the printed circuit board 401 and has first and second sides itself. The second side of the cooling plate 402 is in direct thermal contact with the semiconductor device 404.

The spring plate 403 is arranged adjacent to the second side of the printed circuit board 402 and may be wave-like embossed, such that it comprises at least one dome 407. The dome 407 is preferably located in that area of the printed circuit board 401 where on the other side the semiconductor device 404 is attached to the printed circuit board, and is preferably higher than all other waves or domes of the spring plate 403. Thus, the dome 407 forces the semiconductor device 404 against the cooling plate 402 via the printed circuit board 401. The spring plate 403 includes apertures 406 corresponding to the apertures 405 of the printed circuit board 401, and has on its outer side a cover member established by a cover plate 413 attached thereto.

To connect the cover plate 413 to the spring plate 403 and both to the cooling plate 402, bolts 410 extend through apertures 414 in the cover plate 413, spacer leeves 423, the apertures 405 of the printed circuit board 401, and the apertures 406 of the spring plate 403. The bolts are screwed into tap holes 412 arranged in integral noses 411 formed in a single piece from the cooling plate 402. The height of the semiconductor device 404 exceeds all other elements arranged on this side of the printed circuit board 401.

Figure 5:
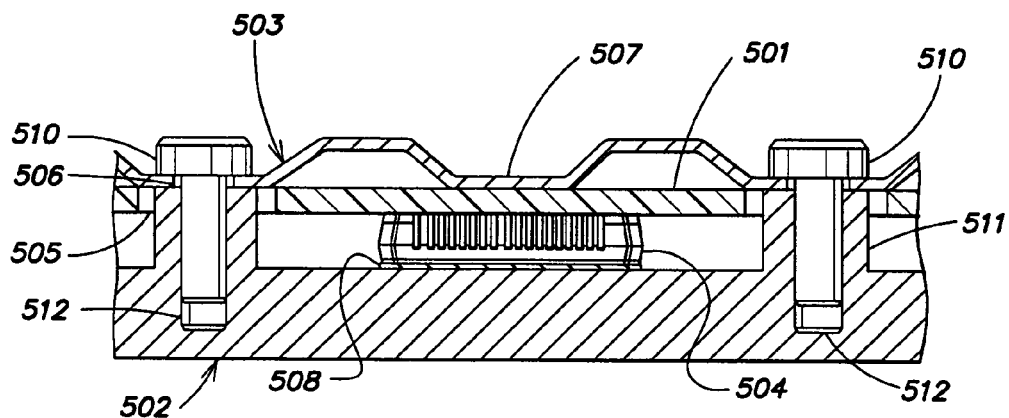
FIG. 5 is a sectional view of another printed circuit board sandwiched between a cooling plate and a spring plate, the spring plate being connected to the cooling plate by integral noses.

As shown in FIG. 5, in yet another embodiment a printed circuit board 501 is sandwiched between a cooling plate 502 and a spring plate 503. The printed circuit board 501, the cooling plate 502, and the spring plate 503 are substantially the same as those illustrated in FIGS. 3 and 4.

The printed circuit board 501 has first and second sides and includes a plurality of apertures 505 formed through the first and second sides. On the first side of the printed circuit board 501 a semiconductor device 504 is arranged. The cooling plate 502 is adjacent to the first side of the printed circuit board 501 and has first and second sides itself. The second side of the cooling plate 502 has thermal contact with the semiconductor device 504, the thermal contact is improved by a heat conductive device 508 (e.g., a thermal compound) located between the semiconductor device 504 and the cooling plate 502.

The spring plate 503 is arranged adjacent to the second side of the printed circuit board 501 and is wave-like embossed such that it includes a dome 507. The dome 507 is preferably located in that area of the printed circuit board 501 where on the other side the semiconductor device 504 is attached and is preferably higher than all other waves or domes of the spring plate 503. Thus, the dome 507 forces the semiconductor device 504 against the cooling plate 502 by exerting force to the printed circuit board 501, which exerts force to the semiconductor device 504. The spring plate 503 comprises apertures 506 corresponding to the apertures 505 of the printed circuit board 501.

To connect the spring plate 503 to the cooling plate 502, bolts 510 extend through the apertures 505 of the printed circuit board 501, and the apertures 506 of the spring plate 503 are screwed into tap holes 512 arranged in integral noses 511 formed in a single piece from the cooling plate 502. The height of the semiconductor device 504 exceeds all other elements arranged on this side of the printed circuit board 501.

Figure 6:
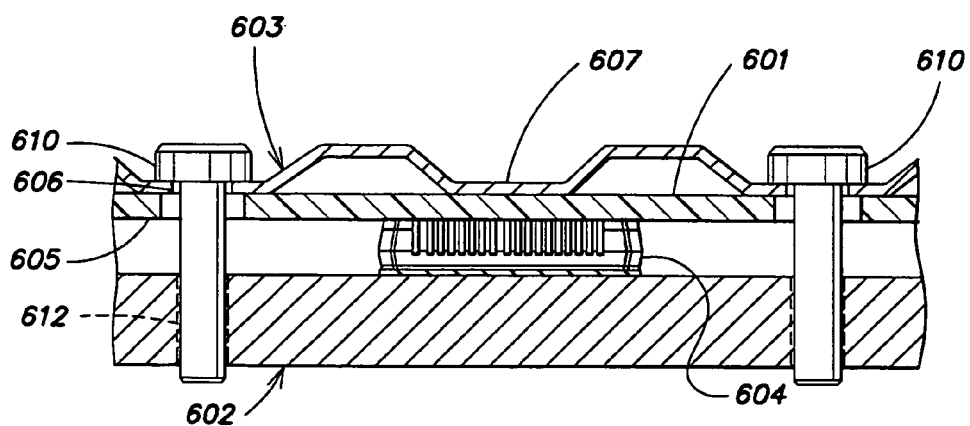
FIG. 6 is a sectional view of another printed circuit board sandwiched between a cooling plate and a spring plate, the spring plate being connected to the cooling plate by bolts.

The apparatus illustrated in FIG. 6 is similar to the apparatus illustrated in FIG. 5, wherein, again, a printed circuit board 601 including a semiconductor device 604 is sandwiched between a cooling plate 602 and a spring plate 603. However, the cooling plate 602 comprises no integral noses as the cooling plate 502 of FIG. 5. Instead, tap holes 612 corresponding to apertures 605 in the printed circuit board 601 and apertures 606 in the spring plate 603 are inserted into the cooling plate 602. Bolts 610 extending through the apertures 605 and 606 are screwed into the tap holes 612. The torque provided by the bolts 610 controls the spring force forcing the semiconductor device 604 against the cooling plate 602. Therefore, by screwing the bolts 610 more or less into the tap holes 612, the spring force pressing the semiconductor device 604 against the cooling plate 602 can be adjusted. In the apparatus of FIG. 6, as well as in the apparatus of FIG. 5, the respective spring plates 603, 503 also serve as covers.

Figure 7:
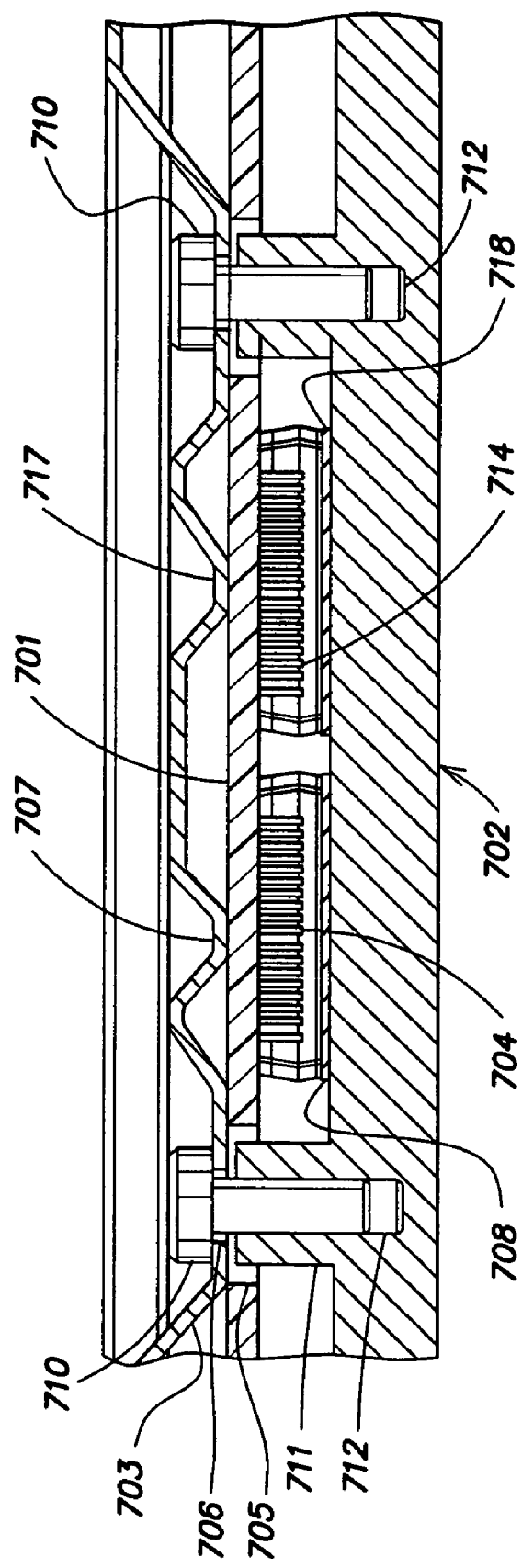
FIG. 7 is a sectional view of another printed circuit board sandwiched between a cooling plate and a spring plate, the printed circuit board having two semiconductor devices mounted thereon.

The apparatus of FIG. 7 is similar to the apparatus shown in FIG. 5, wherein, however, a printed circuit board 701 having two semiconductor devices 704 and 714 is sandwiched between a cooling plate 702 and a spring plate 703. The printed circuit board 701 includes first and second sides and comprises a plurality of apertures 705 formed through the first and second sides. On the first side of the printed circuit board 701 the two semiconductor devices 704 and 714 are arranged The cooling plate 702 is adjacent to the first side of the printed circuit board 701 and has first and second sides itself. The second side of the cooling plate 702 is in thermal contact with the semiconductor devices 704 and 714, which is improved by a heat conductive component 708 and 718.

The spring plate 703 is arranged adjacent to the second side of the printed circuit board 702 and is wave-like embossed such that it comprises at least two domes 707 and 717. The domes 707 and 717 are located in areas of the printed circuit board 701 where on the other side the semiconductor devices 704 and 714 are attached respectively. Both domes 707 and 717 have the same height and are as high as or higher than all other waves or domes of the spring plate 703. Thus, the domes 707 and 717 force the semiconductor devices 704 and 714 against the cooling plate 702 by exerting force to the printed circuit board 701, which exerts force to the semiconductor devices 704 and 714. The spring plate 703 includes apertures 706 in alignment with the apertures 705 of the printed circuit board 701.

To connect the spring plate 703 to the cooling plate 702, bolts 710 serving as securing members are provided that extend through the apertures 705 of the printed circuit board 701, and the apertures 706 of the spring plate 703 and are screwed into tap holes 712 arranged in integral noses 711 formed in a single piece from the cooling plate 702. The semiconductor devices 704 and 714 have the same height that exceeds all other elements arranged on this side of the printed circuit board 701.

Although various exemplary embodiments of the invention have been disclosed, it will be apparent to those skilled in the art that various changes and modifications can be made that achieve some of the advantages of the invention without departing from the spirit and scope of the invention. It will be obvious to those reasonably skilled in the art that other components performing the same functions may be suitably substituted. For example, rather than threaded blind holes as tap holes, threaded contact holes may be used and vice versa. The spring plate may be made of rubber or plastic instead of metal. The semiconductor devices may be integrated circuits or discrete devices in all available and possible packages, for example Dual-In-Line (DIL) packages or power packages preferably Power S036.

The illustrations have been discussed with reference to functional blocks identified as modules and components that are not intended to represent discrete structures and may be combined or further sub-divided. In addition, while various embodiments of the invention have been described, it will be apparent to those of ordinary skill in the art that other embodiments and implementations are possible that are within the scope of this invention. Accordingly, the invention is not restricted except in light of the attached claims and their equivalents.

What is claimed is:

1. An apparatus for cooling semiconductor devices attached to a printed circuit board, the apparatus comprising:
a printed circuit board having first and second sides, the first side having a semiconductor device attached thereto, the printed circuit board further comprising a plurality of printed circuit board apertures formed through the first and second sides;
a cooling member adjacent the first side of the printed circuit board and being in thermal contact with the semiconductor device;
a spring member adjacent the second side of the printed circuit board; and
securing members connecting the spring member to the cooling member through the printed circuit board apertures in the printed circuit board such that the spring member provides a spring force forcing the semiconductor device against the cooling member,
where the spring member provides a spring force to the printed circuit board, and the printed circuit board forces the semiconductor device against the cooling member, and the spring member comprises a dome that is in contact with the printed circuit board.

2. An apparatus for cooling semiconductor devices attached to a printed circuit board, the apparatus comprising:
a printed circuit board having first and second sides, the first side having a semiconductor device attached thereto, the printed circuit board further comprising a plurality of printed circuit board apertures formed through the first and second sides;
a cooling member adjacent the first side of the printed circuit board and being in thermal contact with the semiconductor device;
a spring member adjacent the second side of the printed circuit board; and
securing members connecting the spring member to the cooling member through the printed circuit board apertures in the printed circuit board such that the spring member provides a spring force forcing the semiconductor device against the cooling member,
where the spring member provides a spring force to the printed circuit board, and the printed circuit board forces the semiconductor device against the cooling member, and the spring member comprises a dome, and the printed circuit board comprises a further aperture; the dome located in the further aperture being in contact with the semiconductor device.

3. The apparatus of claim 2, wherein the spring member has first and second sides and comprises a plurality of spring apertures formed through the first and second sides, and wherein the securing members extend through the spring apertures in the spring member.

4. The apparatus of claim 3, where the first side of the spring member is adjacent to the second side of the printed circuit board, and where the apparatus further comprises a cover member adjacent the second side of the spring member.

5. The apparatus of claim 2, where the securing members comprise bolts.

6. The apparatus of claim 5, where the cooling member comprises tap holes into which the bolts are secured.

7. The apparatus of claim 6, where the bolts are secured with a certain torque, and where the torque is adjustable to adjust the spring force provided by the spring member.

8. The apparatus of claim 1, where the spring force provided by the spring member is adjustable by the dome size.

9. The apparatus of claim 2, where the cooling member includes at least one integral nose formed therein.

10. The apparatus of claim 9, where the spring member is secured to the at least one integral nose.

11. The apparatus of claim 2, where a thermal conductive layer is arranged between the semiconductor device and the cooling member.

12. The apparatus of claim 2, where the spring member is wave-like embossed.

13. The apparatus of claim 2, where the spring member comprises a spring plate.

14. The apparatus of claim 2, where the cooling member comprises a cooling plate.

15. The apparatus of claim 4, where the cover member comprises a cover plate.

16. An electronic assembly, comprising:
a semiconductor device mounted on a printed circuit board;
a leaf spring;
a cooling plate; and
a plurality of fasteners that pass through co-axial apertures of the leaf spring, the printed circuit board and into the cooling plate, such that a contact surface of the leaf spring imparts a force on the semiconductor device to retain the semiconductor device in a thermally conductive position with respect to the cooling plate, where leaf spring imparts the force directly upon the semiconductor device.

17. The apparatus of claim 16, where the leaf spring imparts the force directly upon a first surface of the printed circuit board and the semiconductor device is mounted on a second surface of the printed circuit board such that the force causes the semiconductor device to contact the cooling plate.

18. The apparatus of claim 16, where the leaf spring comprises at least two leaf spring apertures where an associated one of the plurality of fasteners passes through an associated one of the leaf spring apertures.

19. An electronic assembly, comprising:
a semiconductor device mounted on a first side of a printed circuit board and over a semiconductor mounting aperture of the printed circuit board;
a leaf spring having a contact dome;
a cooling plate; and
a plurality of fasteners that pass through co-axial apertures of the leaf spring, the printed circuit board and into tap holes of the cooling plate, such that the contact dome of the leaf spring imparts a force on the semiconductor device to retain the semiconductor device in a thermally conductive position with respect to cooling the plate.

20. The electronic assembly of claim 19, where the semiconductor device directly contacts the cooling plate to transfer heat from the semiconductor to the cooling plate.

21. The electronic assembly of claim 19, comprising a heat conductive element that is mounted between and contacts the semiconductor device and the cooling plate.

22. The electronic assembly of claim 21, where the heat conductive element comprises a thermal compound.

23. The electronic assembly of claim 19, where the plurality of fasteners comprises a plurality of threaded fasteners.

24. An electronic assembly, comprising:
a semiconductor device mounted on a first side of a printed circuit board;
a leaf spring having a contact dome;
a cooling plate; and a plurality of fasteners that pass through co-axial apertures of the leaf spring, the printed circuit board and into tap holes of the cooling plate, such that the contact dome of the leaf spring imparts a force on a second side of the printed circuit board to retain the semiconductor device in a continuous thermally conductive position with respect to the cooling plate, where the first and second sides are parallel surfaces and the contact dome applies the force on the second side at a location opposite to the location of the semiconductor device on the side.

25. The electronic apparatus of claim 24, where the plurality of fasteners comprise threaded fasteners that may be rotated to control the amount of force the contact dome applies to the second side of the printed circuit board.

26. The electronic apparatus of claim 24, further comprising:

a cover plate having a plurality of cover plate apertures; and a plurality of spacer leaves each having a plurality of spacer leave apertures, where each of the plurality of fasteners passes through an associated one of the cover plate apertures, the spacer leave apertures, the spacer leave apertures and the co-axial apertures of the printed circuit board and the tap holes of the cooling plate, and the plurality of spacer leaves separate the cover plate and the leaf spring in the area immediately adjacent to each of the plurality of fasteners.

* * * * *

UNITED STATES PATENT AND TRADEMARK OFFICE
CERTIFICATE OF CORRECTION

PATENT NO. : 7,187,553 B2
APPLICATION NO. : 10/914624
DATED : March 6, 2007
INVENTOR(S) : Stefan Schmidberger Page 1 of 1

It is certified that error appears in the above-identified patent and that said Letters Patent is hereby corrected as shown below:

Column 1
Line 33, after "age" delete ","

Column 4
Line 5, delete "embossing" and insert --embossing,--

Column 6
Line 14, delete "arranged" and insert --arranged.--

Column 7
Line 48, delete "wherein" and insert --where--
Line 51, delete "wherein" and insert --where--

Column 8
Line 27, before "leaf" insert --the--
Line 50, before "cooling" insert --the--
Line 51, before "plate" delete "the"

Column 9
Line 11, before "side" insert --first--

Signed and Sealed this

First Day of May, 2007

JON W. DUDAS
*Director of the United States Patent and Trademark Office*